United States Patent
Lim et al.

(10) Patent No.: US 10,917,969 B2
(45) Date of Patent: *Feb. 9, 2021

(54) DISPLAY DEVICE COUPLED TO CIRCUIT BOARD WITH COUPLING FILM

(71) Applicant: Samsung Display Co., Ltd., Yongin-Si (KR)

(72) Inventors: Kyung-hwa Lim, Yongin-si (KR); Sangan Kwon, Cheonan-si (KR); Kyunho Kim, Cheonan-si (KR); Yong-jin Shin, Asan-si (KR); Shimho Yi, Seoul (KR); Heebum Park, Seongnam-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/786,113

(22) Filed: Feb. 10, 2020

(65) Prior Publication Data

US 2020/0178393 A1 Jun. 4, 2020

Related U.S. Application Data

(63) Continuation of application No. 15/715,551, filed on Sep. 26, 2017, now Pat. No. 10,595,408.

(30) Foreign Application Priority Data

Nov. 25, 2016 (KR) .................. 10-2016-0158648

(51) Int. Cl.
*H05K 1/14* (2006.01)
*G09G 3/20* (2006.01)
(Continued)

(52) U.S. Cl.
CPC ............ *H05K 1/142* (2013.01); *G09G 3/2092* (2013.01); *H05K 1/028* (2013.01); *H05K 1/111* (2013.01);
(Continued)

(58) Field of Classification Search
CPC ........... G09G 2310/08; G09G 2380/02; G09G 3/2092; G09G 3/3225; G09G 3/3648;
(Continued)

(56) References Cited

U.S. PATENT DOCUMENTS 7,887,210 B2 2/2011 Kim
8,493,418 B2 7/2013 Min et al.
(Continued)

FOREIGN PATENT DOCUMENTS

CN 101819339 A 9/2010
CN 101908325 A 12/2010
(Continued)

OTHER PUBLICATIONS

Chinese Office Action for Application No. 201711127891.7 dated Dec. 17, 2020 enumerating the above listed references.

*Primary Examiner* — Chun-Nan Lin
(74) *Attorney, Agent, or Firm* — Cantor Colburn LLP

(57) ABSTRACT

A display device includes a display panel, a first circuit board, a control unit disposed on the first circuit board, a second circuit board, and a coupling film which electrically couples the control unit and the second circuit board to each other. The coupling film includes a first coupling part including a first region attached to the first circuit board, and a second region overlapping the display panel when viewed in a thickness direction of the display panel, a second coupling part including a third region attached to the second circuit board, and a fourth region overlapping the display panel when viewed in the thickness direction of the display (Continued)

panel, and a third coupling part coupled to each of the second region and the fourth region to electrically couple the first coupling part and the second coupling part to each other.

11 Claims, 17 Drawing Sheets

(51) Int. Cl.
*H05K 1/02* (2006.01)
*H05K 1/11* (2006.01)
*H05K 1/18* (2006.01)
*H05K 3/36* (2006.01)
*G09G 3/3225* (2016.01)
*G09G 3/36* (2006.01)

(52) U.S. Cl.
CPC ............... *H05K 1/147* (2013.01); *H05K 1/18* (2013.01); *G09G 3/3225* (2013.01); *G09G 3/3648* (2013.01); *G09G 2310/08* (2013.01); *G09G 2380/02* (2013.01); *H05K 3/363* (2013.01); *H05K 2201/055* (2013.01); *H05K 2201/058* (2013.01); *H05K 2201/09027* (2013.01); *H05K 2201/09036* (2013.01); *H05K 2201/10128* (2013.01)

(58) Field of Classification Search
CPC ........ H05K 1/028; H05K 1/111; H05K 1/142; H05K 1/147; H05K 1/18; H05K 2201/055; H05K 2201/058; H05K 2201/09027; H05K 2201/09036; H05K 2201/10128; H05K 3/363

See application file for complete search history.

(56) References Cited

U.S. PATENT DOCUMENTS

| | | |
|---|---|---|
| 8,582,070 B2 | 11/2013 | Lee et al. |
| 9,713,256 B2 | 7/2017 | Jeon |
| 2009/0067124 A1* | 3/2009 | Lai ...................... G02F 1/13452 361/679.01 |
| 2010/0084160 A1* | 4/2010 | Braun .................. H01R 12/778 174/117 FF |
| 2011/0235286 A1* | 9/2011 | Kitayama ............... H05K 1/147 361/749 |
| 2013/0148315 A1* | 6/2013 | Dabov .................. G06F 1/1613 361/749 |
| 2013/0265290 A1* | 10/2013 | Lee .......................... G09G 3/34 345/211 |
| 2014/0204066 A1 | 7/2014 | Park |
| 2015/0208522 A1 | 7/2015 | Kim et al. |
| 2016/0181572 A1 | 6/2016 | Prushinskiy et al. |
| 2016/0338197 A1* | 11/2016 | Sakurai ................ H05K 1/0237 |

FOREIGN PATENT DOCUMENTS

| | | |
|---|---|---|
| CN | 102478728 A | 5/2012 |
| CN | 105448252 A | 3/2016 |
| CN | 205665971 U | 10/2016 |
| EP | 0730186 A1 | 9/1996 |
| KR | 1020040100756 A | 12/2004 |
| KR | 1020060002101 A | 1/2006 |
| KR | 100669453 B1 | 1/2007 |
| KR | 1020140063141 A | 5/2014 |
| KR | 1020160103241 A | 9/2016 |
| WO | 2015145975 | 10/2015 |

* cited by examiner

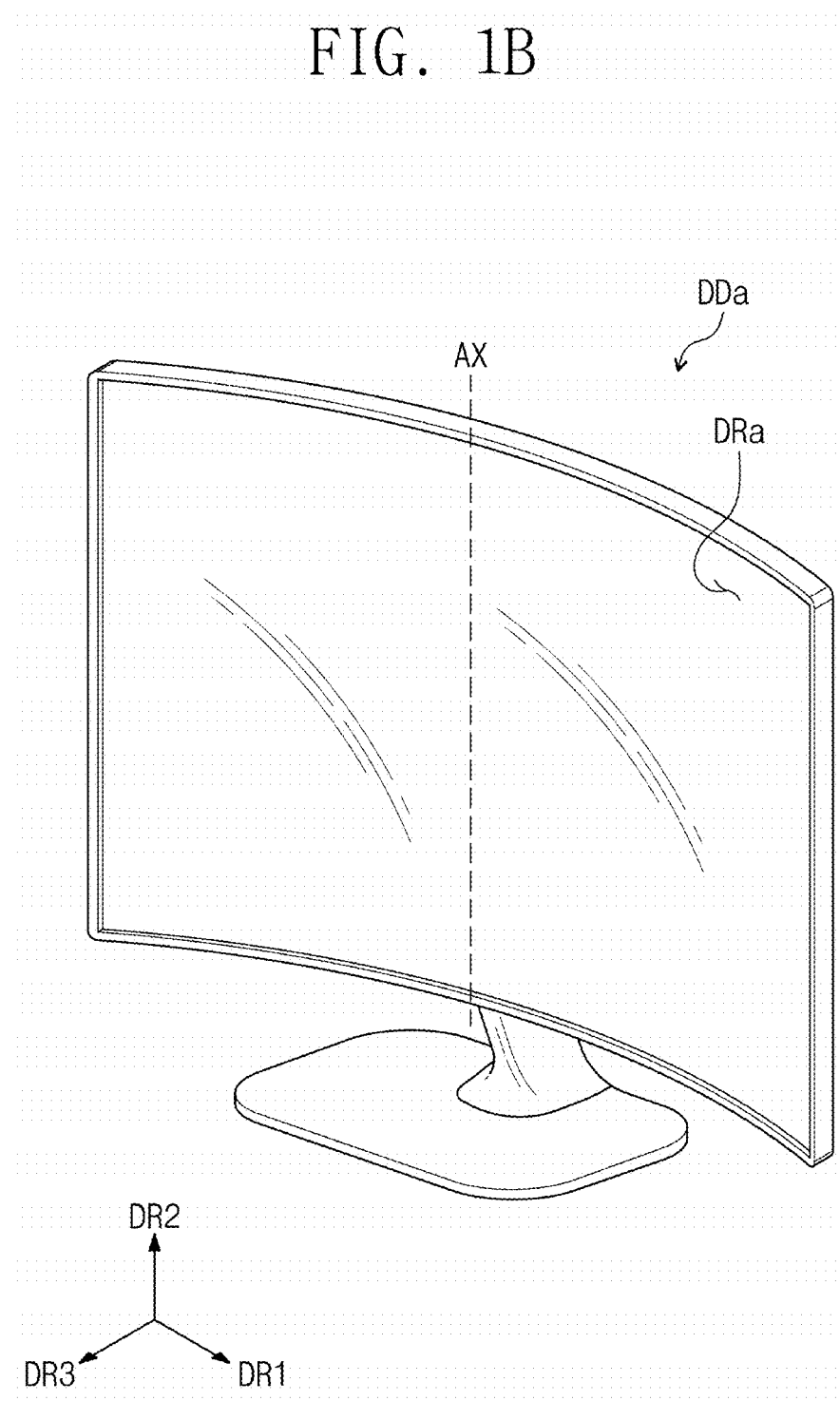

DISPLAY DEVICE COUPLED TO CIRCUIT BOARD WITH COUPLING FILM

This application is a continuation of U.S. patent application Ser. No. 15/715,551, filed on Sep. 26, 2017, which claims priority to Korean Patent Application No. 10-2016-0158648, filed on Nov. 25, 2016, and all the benefits accruing therefrom under 35 U.S.C. § 119, the content of which in its entirety is herein incorporated by reference.

BACKGROUND

1. Field

The disclosure herein relates to a display device, and more particularly, to a display device with improved reliability.

2. Description of the Related Art

A display device may include a display panel, a flexible circuit board including a driving circuit mounted thereon for driving the display panel, and a circuit board including a control unit mounted thereon for transmitting power and signals. The circuit board may be provided in plurality as the size or the resolution of the display device increases.

SUMMARY

The disclosure relates to a display device with improved reliability.

An embodiment of a display device according to the invention includes: a display panel including a circuit unit and a display unit connected to the circuit unit; a first circuit board electrically coupled to the circuit unit; a control unit disposed on the first circuit board and electrically coupled to the first circuit board; a second circuit board electrically coupled to the circuit unit; and a coupling film which electrically couples the control unit and the second circuit board to each other. In such an embodiment, the coupling film includes: a first coupling part including a first region attached to the first circuit board, and a second region overlapping the display panel when viewed in a thickness direction of the display panel; a second coupling part having a third region attached to the second circuit board, and a fourth region overlapping the display panel when viewed in the thickness direction of the display panel; and a third coupling part coupled to each of the second region and the fourth region to electrically couple the first coupling part and the second coupling part to each other.

In an embodiment, an outline of the third coupling part, which couples the first coupling part and the second coupling part to each other, may have a rounded shape.

In an embodiment, the third coupling part may extend from the first coupling part toward the second coupling part, and the first coupling part, the second coupling part, and the third coupling part may collectively define a single unitary body.

In an embodiment, the first circuit board and the second circuit board may be disposed to be spaced apart in a first direction, the coupling film may have a shape bent along a bending line extending in the first direction, and the third coupling part may overlap each of the first coupling part and the second coupling part when viewed in the thickness direction of the display panel.

In an embodiment, the bending line may be defined in the third coupling part, and the third coupling part may be disposed above the first coupling part and the second coupling part.

In an embodiment, the bending line may be defined between the first region and the second region of the first coupling part, and between the third region and the fourth region of the second coupling part, and the third coupling part may be disposed below the first coupling part and the second coupling part.

In an embodiment, one of two opposing surfaces of the first coupling part may be attached to the first circuit board, and the other of the two opposing surfaces of the first coupling part may be attached to the display panel, and one of two opposing surfaces of the second coupling part may be attached to the second circuit board, and the other of the two opposing surfaces of the second coupling part may be attached to the display panel.

In an embodiment, a concave groove recessed along the bending line may be defined in the coupling film.

In an embodiment, a plurality of concave grooves recessed along the bending line may be defined in a bending region including the bending line of the coupling film, and a cross section of the bending region taken in a direction perpendicular to the bending line may have a corrugated shape.

In an embodiment, the third coupling part may be attached to the second region of the first coupling part, and the fourth region of the second coupling part.

In an embodiment, the coupling film may further include: a first coupling member disposed between the first coupling part and the third coupling part to couple the first coupling part and the third coupling part to each other; and a second coupling member disposed between the second coupling part and the third coupling part to couple the second coupling part and the third coupling part together.

In an embodiment, the first coupling part may be disposed between the display panel and the third coupling part, and the second coupling part may be disposed between the display panel and the third coupling part.

In an embodiment, the third coupling part may be disposed between the display panel and the first coupling part, and between the display panel and the second coupling part.

In an embodiment, each of the first coupling part, the second coupling part, and the third coupling part may include: a first base layer; a wiring layer disposed on the first base layer; and a second base layer disposed on the wiring layer, wherein the wiring layer of the first coupling part and the wiring layer of the third coupling part are electrically coupled to each other via the first coupling member, and the wiring layer of the second coupling part and the wiring layer of the third coupling part are electrically coupled to each other via the second coupling member, such that the wiring layers of the first coupling part, the second coupling part, and the third coupling part are electrically coupled to each other.

In an embodiment, an opening region for exposing the wiring layer may be defined in the first base layer or the second base layer of each of the second region of the first coupling part, the fourth region of the second coupling part, and predetermined regions of the third coupling part, where the predetermined regions of the third coupling part face the second region and the fourth region.

In an embodiment, the coupling film may further include a pad part disposed through the first base layer or the second base layer of each of the second region of the first coupling part, the fourth region of the second coupling part, and predetermined regions of the third coupling part, where the predetermined regions of the third coupling part face the second region and the fourth region, and the pad part of each of the first coupling part, the second coupling part and the third coupling part may be electrically coupled to the wiring layer thereof via a through-hole defined in the first base layer or the second base layer thereof.

In an embodiment, the display panel may be a flat display panel, or a curved display panel having a predetermined curvature.

In an embodiment, the control unit may include a timing controller connected to the circuit unit and a power supply unit which supplies a power to the display panel.

An embodiment of the invention provides a display device including: a display panel; a plurality of flexible circuit boards attached to a side of the display panel; a first circuit board coupled to some flexible circuit boards of the plurality of flexible circuit boards; a second circuit board coupled to the remaining flexible circuit boards of the plurality of flexible circuit boards; and a coupling film disposed between the some flexible circuit boards and the remaining flexible circuit boards to be attached to each of the first circuit board, the second circuit board, and the display panel. In such an embodiment, the coupling film includes a bending region bent along a bending line extending in a direction parallel to the side of the display panel, and the bending region is attached to the display panel.

In an embodiment, a concave groove extending in a direction parallel to the side of the display panel may be defined in the bending region.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to describe principles of the invention. In the drawings:

FIG. 1B is a perspective view illustrating a display device according to an embodiment of the invention;

DETAILED DESCRIPTION

Figure 1A:
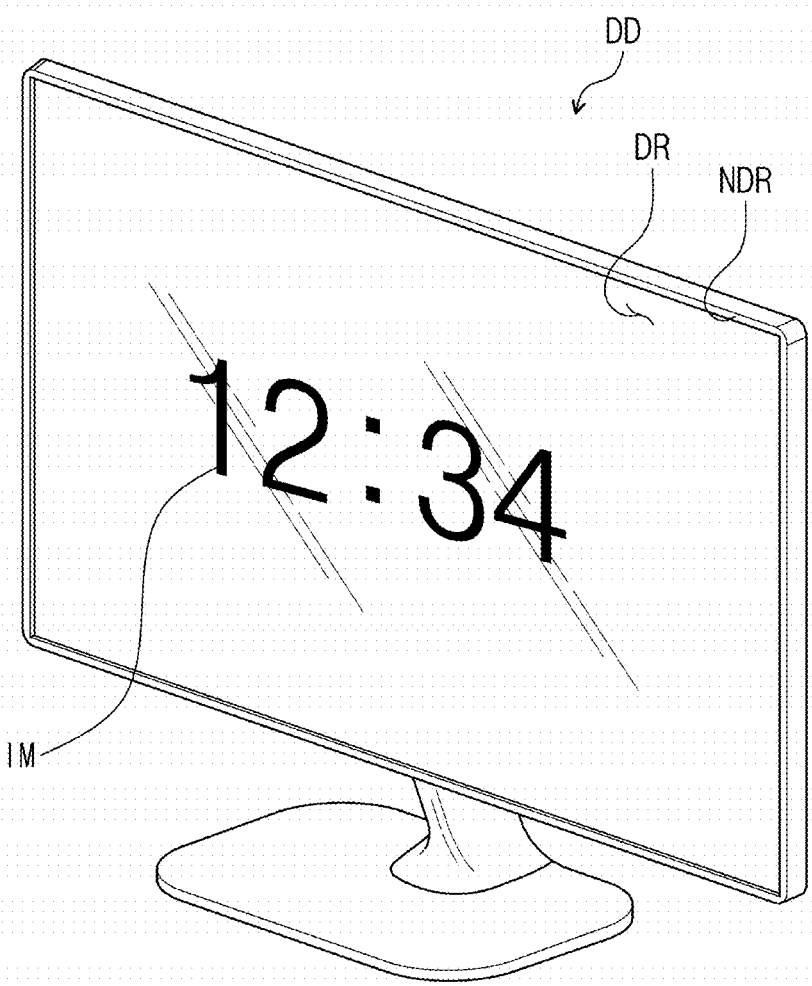
FIG. 1A is a perspective view illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element, region, layer, or part is referred to as being "on", "connected to" or "coupled to" another element, region, layer, or part, it can be directly on, connected or coupled to the other element, region, layer, or part, or intervening elements, regions, layers, or parts may be present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings herein. Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the invention will be described in detail with reference to the accompanying drawings FIG. 1A is a perspective view illustrating a display device according to an embodiment of the invention.

Referring to FIG. 1A, an embodiment of a display device DD may be included in a monitor. Such an embodiment of the display device DD may be used not only for large-sized electronic devices such as a television, and an outdoor advertising display apparatus, but also for small- and medium-sized electronic devices such as a personal computer, a notebook computer, a personal digital assistant, a car navigation device, a game machine, a mobile electronic device, and a camera, but not being limited thereto. Alternatively, the display device DD may also be used for other electronic devices as long as the other electronic devices do not deviate from the concept of the invention.

The display device DD includes a plurality of regions divided on a display surface. The display device DD may include a display region DR on which an image IM is displayed, and a non-display region NDR adjacent to the display region DR. In FIG. 1A, a clock window is illustrated as an example of the image IM. The display surface on which the image IM is displayed is parallel to a surface defined by a first direction DR1 and a second direction DR2, and a normal direction of the display surface is indicated by a third direction DR3. The third direction DR3 is a reference direction by which a front and a rear of each member are defined.

FIG. 1B is a perspective view illustrating a display device according to an embodiment of the invention.

Referring to FIG. 1B, an embodiment of a display device DDa may provide a curved display region DRa. The display region DRa may have a curved display surface against a flat surface defined by the first direction DR1 and the second direction DR2, with respect to a reference axis AX parallel to the second direction DR2.

In an embodiment, as shown in FIG. 1B, the display region DRa may be concavely curved with respect to the first direction DR1 is to provide a concave display surface, but the invention is not limited thereto. In one alternative embodiment, for example, the display region DRa may be convexly curved with respect to the first direction DR1 so that the display device DDa provides a convex display surface.

Figure 2:
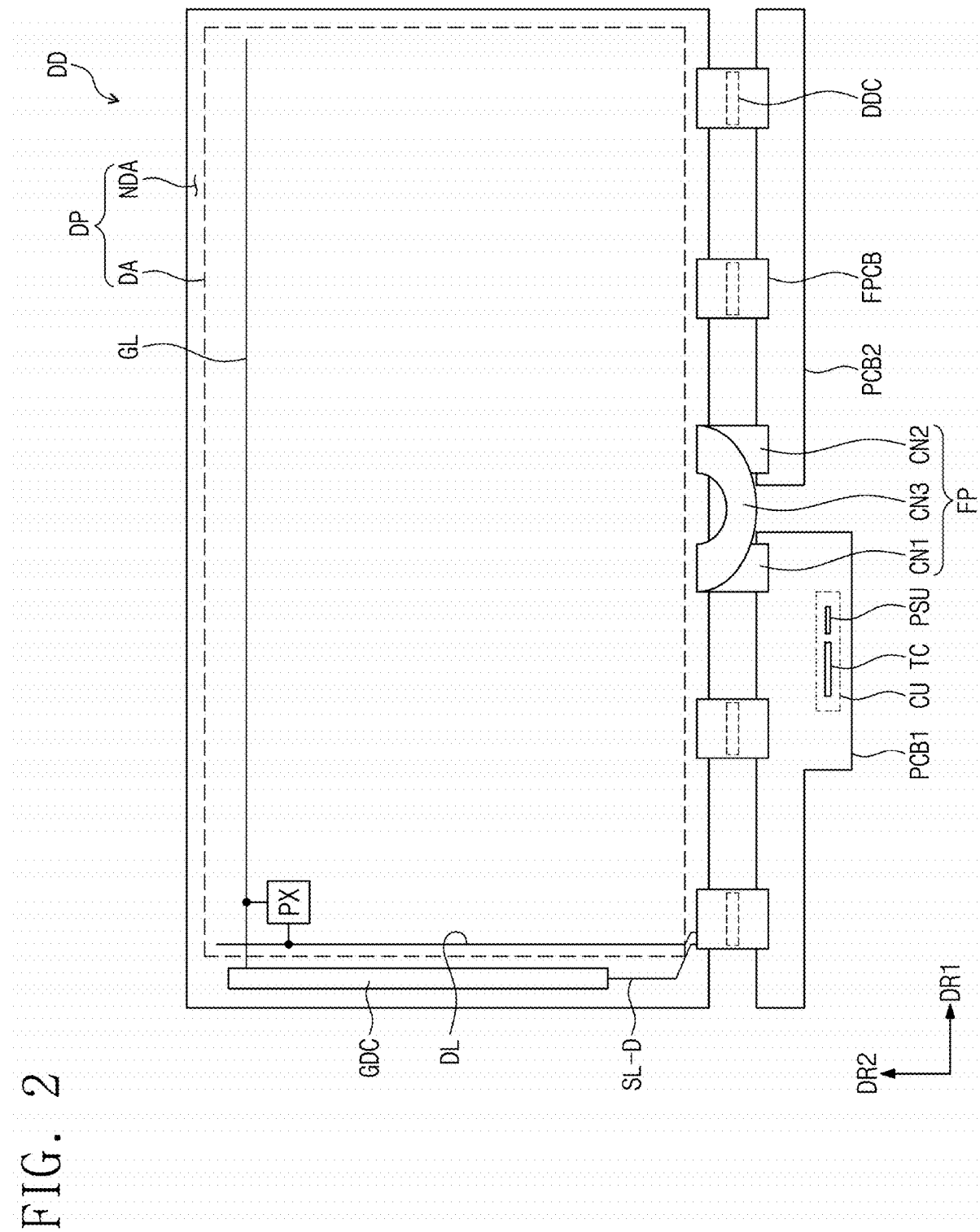
FIG. 2 a schematic plan view illustrating parts of a display device according to an embodiment of the invention.

FIG. 2 a schematic plan view illustrating parts of a display device according to an embodiment of the invention.

Referring to FIG. 2, an embodiment of the display device DD may include a display panel DP, a first circuit board PCB1, a second circuit board PCB2, a plurality of flexible circuit boards FPCB, and a coupling film FP.

The display panel DP includes a display area DA and a non-display area NDA when viewed from a front plan view. The display area DA and the non-display area NDA of the display panel DP correspond to the display region DR (see FIG. 1A.) and the non-display region NDR (see FIG. 1A.) of the display device DD, respectively. The display area DA and the non-display area NDA of the display panel DP may not be the same as the display region DR (see FIG. 1A.) and the non-display region NDR (see FIG. 1A.) of the display device DD, respectively, but may change according to a structure/design of the display panel DP.

The display panel DP may adopt one of various types of display panel such as a liquid crystal display panel, an organic light-emitting display panel, a plasma display panel, an electrophoretic display panel, and an electrowetting display panel, for example, but not being limited thereto.

The display panel DP includes a plurality of pixels PX. An area, in which the plurality of pixels PX is arranged, is defined as the display area DA. In such an embodiment, the non-display area NDA may be defined along the edge of the display area DA.

The display panel DP may include a circuit unit and a display unit. The circuit unit may include a gate driving circuit GDC, a control signal line SL-D, gate lines GL, and data lines DL.

The gate driving circuit GDC may be disposed on a side portion of the non-display area NDA. However, the gate driving circuit GDC is not limited thereto, but may be disposed on both of opposing side portions of the non-display area NDA.

The gate lines GL may extend from the gate driving circuit GDC in the first direction DR1, and may be respectively connected to corresponding pixels of the plurality of pixels PX. The data lines DL may extend in the second direction DR2, and may be respectively connected to corresponding pixels of the plurality of pixels PX. In FIG. 2, for convenience of illustration, only one of the gate lines GL, one of the data lines DL, and one of the pixels PX are illustrated, and the rest of the gate lines GL, the data lines DL, and the pixels PX are not illustrated.

The display unit may implement an image in response to a signal received from the circuit unit. In an embodiment, the display unit may include a liquid crystal layer, or an organic light-emitting layer. In such an embodiment, the display panel DP may implement an image by controlling alignment of liquid crystal molecules, or light emission of the organic light-emitting layer. However, the invention is not limited thereto.

The plurality of flexible circuit boards FPCB may be coupled to the non-display are NDA of the display panel DP. In one embodiment, for example, the plurality of flexible circuit boards FPCB may be attached to a side portion of the display panel DP. The plurality of flexible circuit boards FPCB may be electrically coupled to the circuit unit of the display panel DP. In an embodiment, the plurality of flexible circuit boards FPCB and the display panel DP may be coupled to each other by an anisotropic conductive film ("ACF").

A driving circuit for driving the display panel DP, for example, a data driving circuit DDC, may be disposed or mounted on each of the plurality of flexible circuit boards FPCB. For convenience of illustration, four data driving circuits DDC and four flexible circuit boards FPCB are illustrated in FIG. 2, but the invention is not limited thereto. In one embodiment, for example, the number of the data driving circuits DDC and the flexible circuit boards FPCB may be variously modified depending on a resolution of the display panel DP, a size of the display panel DP, or a specification of the data driving circuit DDC.

The first circuit board PCB1 and the second circuit board PCB2 may be disposed to be spaced apart in the first direction DR1. The first circuit board PCB1 may be coupled to the display panel DP via some flexible circuit boards of the plurality of flexible circuit boards FPCB, and the second circuit board PCB2 may be coupled to the display panel DP via the remaining flexible circuit boards of the plurality of flexible circuit boards FPCB.

A control unit CU may be disposed or mounted on the first circuit board PCB1. The control unit CU may include a timing controller TC and a power supply unit PSU. The control unit CU may receive a control signal, image data, and external power from outside the display device DD. The control signal may include a vertical synchronization signal which is a frame distinction signal, a horizontal synchronization signal which is a row distinction signal, a data enable signal for indicating a zone in which data come in, and a main clock signal. The control unit CU may be disposed on other circuit board not the first circuit board PCB1.

The timing controller TC generates a gate control signal and a data control signal. The timing controller TC outputs the gate control signal to the gate driving circuit GDC, and outputs the data control signal to the data driving circuit DDC. The timing controller TC converts the image data to conform to the specification of the data driving circuit DDC, and outputs the converted image data to the data driving circuit DDC. The power supply unit PSU may generate and output power used for the display device DD by using the external power.

The coupling film FP may be disposed between the some flexible circuit boards and the remaining flexible circuit boards. The coupling film FP may electrically couple the first circuit board PCB1 and the second circuit board PCB2 to each other. The coupling film FP may transmit, to the second circuit board PCB2, the signals and power outputted from the control unit CU of the first circuit board PCB1.

The coupling film FP may include a first coupling part CN1, a second coupling part CN2, and a third coupling part CN3. The first coupling part CN1 may be attached to the first circuit board PCB1 and the display panel DP, the second coupling part CN2 may be attached to the second circuit board PCB2 and the display panel DP, and the third coupling part CN3 may couple the first coupling part CN1 and the second coupling part CN2 to each other.

Figure 3A:
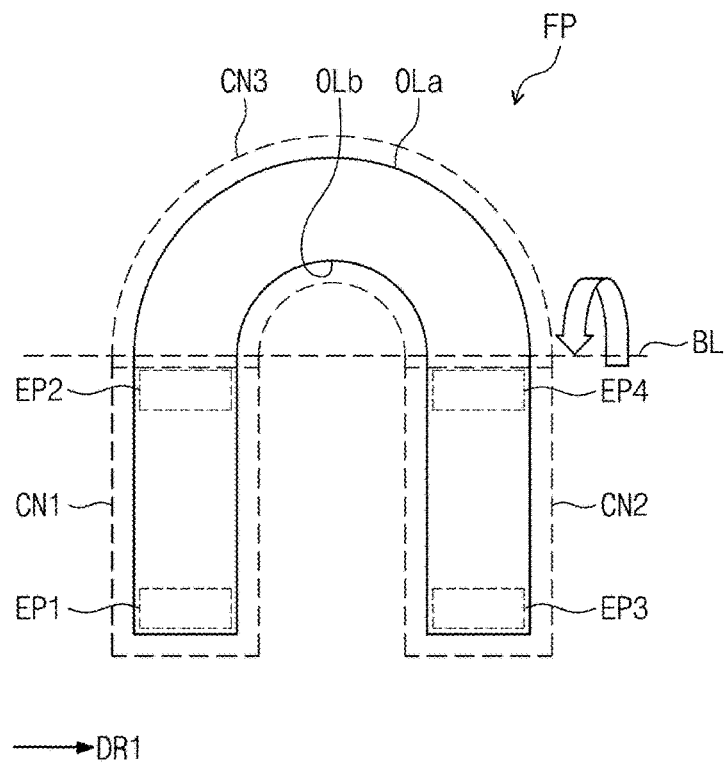
FIG. 3A is a plan view illustrating a coupling film according to an embodiment of the invention.
Figure 3B:
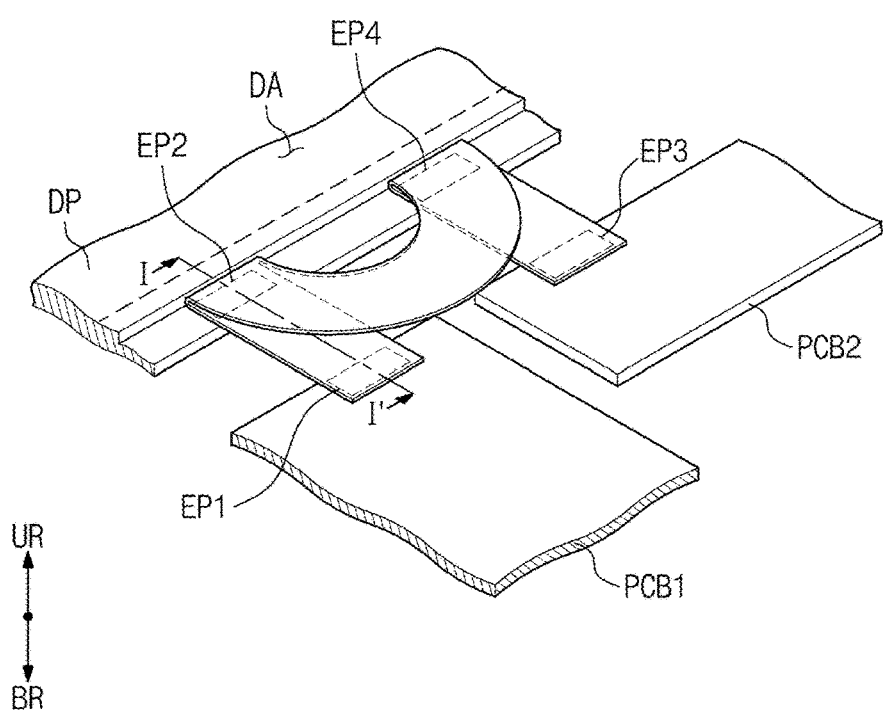
FIG. 3B is an enlarged perspective view illustrating a part of a display device including the coupling film of FIG. 3A.
Figure 3C:
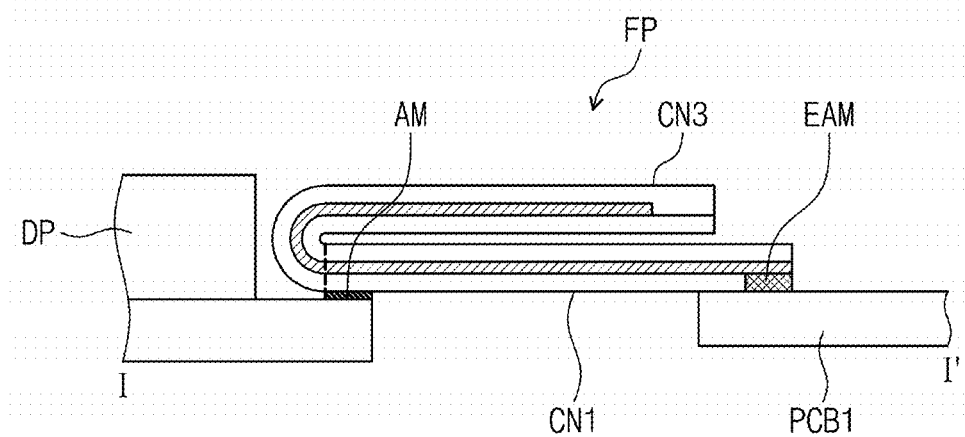
FIG. 3C is a cross-sectional view taken along line I-I' of FIG. 3B.

FIG. 3A is a plan view illustrating a coupling film according to an embodiment of the invention, FIG. 3B is an enlarged perspective view illustrating a part of a display device including the coupling film of FIG. 3A, and FIG. 3C is a cross-sectional view taken along line I-I' of FIG. 3B.

Referring to FIGS. 3A, 3B and 3C, in an embodiment, the first coupling part CN1, the second coupling part CN2 and the third coupling part CN3 may be integrally formed as a single body. In such an embodiment, the first coupling part CN1, the second coupling part CN2 and the third coupling part CN3 may be defined by divided portions of the coupling film FP formed as the single body.

The first coupling part CN1 includes a first region EP1 attached to the first circuit board PCB1, and a second region EP2 attached to the display panel DP. The second coupling part CN2 includes a third region EP3 attached to the second circuit board PCB2, and a fourth region EP4 attached to the display panel DP. The third coupling part CN3 may be coupled to each of the second region EP2 and the fourth region EP4 to electrically couple the first coupling part CN1 and the second coupling part CN2 to each other.

The first region EP1 and the first circuit board PCB1 may be coupled to each other by a conductive adhesive member EAM, and the third region EP3 and the second circuit board PCB2 may be coupled to each other by the conductive adhesive member EAM. The conductive adhesive member EAM may be, for example, an ACF. The second region EP2 and the display panel DP may each be coupled to each other by an adhesive member AM, and the fourth region EP4 and the display panel DP may each be coupled to each other by the adhesive member AM. The adhesive member AM may be composed of conductive matter, or insulating matter. In one embodiment, for example, the adhesive member AM may be organic adhesive matter or double-sided tape including adhesive matter, such as polyurethane-based, polyacryl-based, polyester-based, epoxy-based and polyvinyl acetate-based adhesive matter.

Each of outlines OLa and OLb of the third coupling part CN3, which couples a point of the first coupling part CN1 and a point of the second coupling part CN2 to each other, may have a rounded shape. In an embodiment, where the display panel DP is a curved display panel having predetermined curvature, stress may not focus on a specific region (for example, a vertex of a polygon in the case that outlines have a polygonal shape), but may be dispersed because the outlines OLa and OLb of the third coupling part CN3 have the rounded shape.

In the third coupling part CN3 of the coupling film FP, a bending line BL extending in the first direction DR1 may be defined. In an embodiment, the bending line BL may be parallel to a side of the display panel DP. The bending line BL is a reference line along which the coupling film FP is bent. In an embodiment, the coupling film FP may be bent along the bending line BL after the first coupling part CN1 and the second coupling part CN2 are attached to the display panel DP. However, the coupling film FP is not limited thereto. Alternatively, the coupling film FP may be bent along the bending line BL, and then the coupling film FP in a state bent along the bending line BL may be attached to the display panel DP, the first circuit board PCB1 and the second circuit board PCB2.

In an embodiment of the invention, the first region EP1 and the second region EP2 may be defined on a same surface of the first coupling part CN1. The third coupling part CN3 may be bent in a way such that a surface extending from one surface, which is attached to the display panel DP, of each of the first coupling part CN1 and the second coupling part CN2 faces an upward direction UR. Accordingly, the third coupling part CN3 may not overlap the display area DA.

According to an embodiment of the invention, a bending region bent along the bending line BL of the coupling film FP may be attached to the display panel DP. Accordingly, parts that couples the display panel DP and the first circuit board PCB1 to each other, and the display panel DP and the second circuit board PCB2 to each other, and a part that couples the parts to each other may be divided by the region attached to the display panel DP. Accordingly, the first coupling part CN1 and the second coupling part CN2 may be spaced apart from the first circuit board PCB1 and the second circuit board PCB2 to corresponding points at which the first coupling part CN1 and the second coupling part CN2 are attached to the display panel DP. In such an embodiment, the first coupling part CN1 and the second coupling part CN2 are structurally separated or separately defined, and thus the first coupling part CN1 and the second coupling part CN2 may not transmit force to each other even when the first circuit board PCB1 and the second circuit board PCB2 move in directions different from each other. In one embodiment, for example, even when the first circuit board PCB1 moves in a downward direction BR, and the second circuit board PCB2 moves in the upward direction UR, the first coupling part CN1 may only be bent in the downward direction BR, and the second coupling part CN2 may only be bent in the upward direction UR, thereby transmitting no force to each other. Accordingly, even when the first circuit board PCB1 and the second circuit board PCB2 cause displacements different from each other due to weight difference thereof or the like, the first coupling part CN1 and the second coupling part CN2 may not interfere with each other, and thus no crack (or phenomenon that the coupling film FP is torn) occurs in wiring within the coupling film FP, thereby improving product reliability.

Figure 1A:
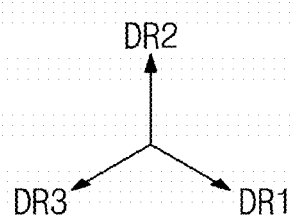

A region adjacent to the border between the first coupling part CN1 and the third coupling part CN3, and a region adjacent to the border between the second coupling part CN2 and the third coupling part CN3 of the coupling film FP may be attached to the display panel DP, and thus the first circuit board PCB1 and the second circuit board PCB2 may be substantially stably fixed to the display panel DP. Accordingly, when positions of the first and second circuit boards PCB1 and PCB2 change, a phenomenon that outermost flexible circuit boards of the flexible circuit boards FPCB (see FIG. 2.) are torn may be improved. In such an embodiment, because the first coupling part CN1 and the second coupling part CN2 are electrically coupled to each other by the third coupling part CN3, the width of the non-display region NDR (see FIG. 1.) of the display device DD (see FIG. 1.) may be minimized, and because movements of the first coupling part CN1 and the second coupling part CN2 do not affect each other, product reliability may be improved.

Figure 4A:
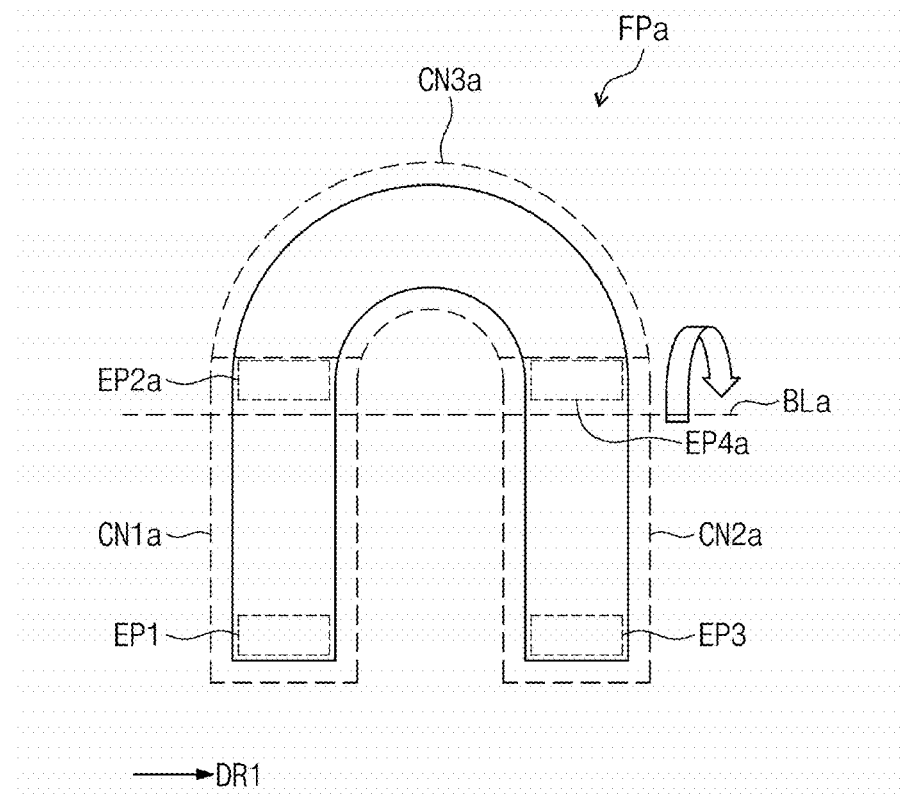
FIG. 4A is a plan view illustrating a coupling film according to an alternative embodiment of the invention.
Figure 4B:
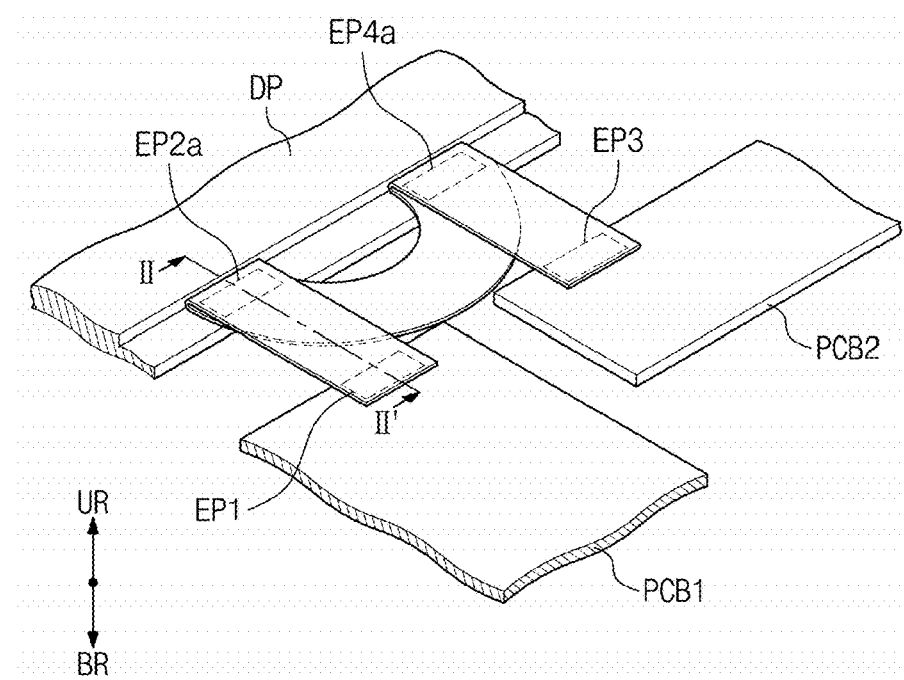
FIG. 4B is an enlarged perspective view illustrating a part of a display device according to an embodiment of the invention.
Figure 4C:
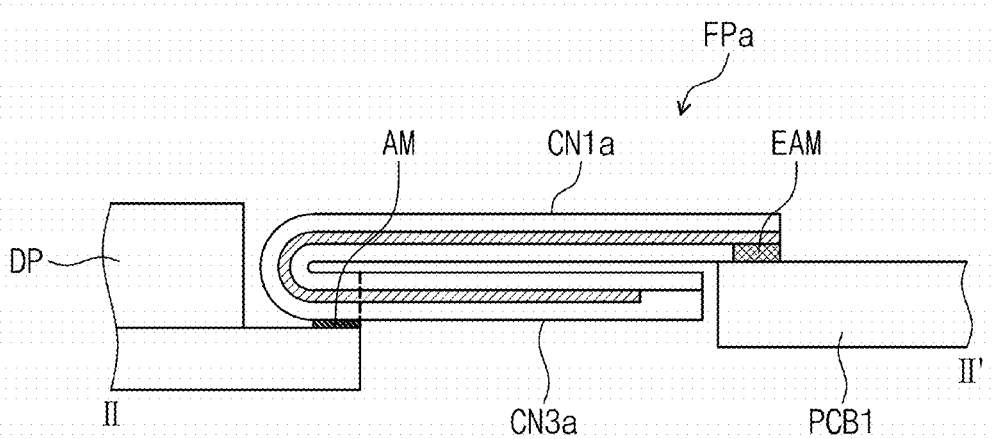
FIG. 4C is a cross-sectional view taken along line II-II' of FIG. 4B.

FIG. 4A is a plan view illustrating a coupling film according to an alternative embodiment of the invention, FIG. 4B is an enlarged perspective view illustrating a part of a display device including the coupling film of FIG. 4A, and FIG. 4C is a cross-sectional view taken along line II-II' of FIG. 4B.

In FIGS. 4A to 4C, the same or like components as those previously described have been labeled with the same reference characters, and any repetitive detailed description thereof will hereinafter be omitted or simplified.

Referring to FIGS. 4A, 4B and 4C, an embodiment of a coupling film FPa may include a first coupling part CN1a, a second coupling part CN2a and a third coupling part CN3a. In such an embodiment, the first coupling part CN1a, the second coupling part CN2a and the third coupling part CN3a may have an integral shape or collectively define a single body.

The first coupling part CN1a includes the first region EP1 attached to the first circuit board PCB1, and a second region EP2a attached to the display panel DP. The second coupling part CN2a includes the third region EP3 attached to the second circuit board PCB2, and a fourth region EP4a attached to the display panel DP. The third coupling part CN3a may be coupled to each of the second region EP2a and the fourth region EP4a to electrically couple the first coupling part CN1a and the second coupling part CN2a to each other.

In each of the first coupling part CN1a and the second coupling part CN2a of the coupling film FPa, a bending line BLa may be defined. The bending line BLa is a reference line along which the coupling film FPa is bent. The bending line BLa may be defined between the first region EP1 and the second region EP2a, and between the third region EP3 and the fourth region EP4a.

According to an embodiment of the invention, a surface of the first coupling part CN1a may be attached to the first circuit board PCB1, and an opposing surface of the first coupling part CN1a may be attached to the display panel DP. In such an embodiment, one surface of opposing surfaces facing each other of the first coupling part CN1a may be attached to the first circuit board PCB1, and the other surface of the opposing surfaces may be attached to the display panel DP. In such an embodiment, a surface of the second coupling part CN2a may be attached to the second circuit board PCB2, and an opposing surface of the second coupling part CN2a may be attached to the display panel DP. The coupling film FPa may be bent in a way such that a surface identical to the surface, which is attached to the display panel DP, of each of the first coupling part CN1a and the second coupling part CN2a faces the downward direction BR.

Figure 5:
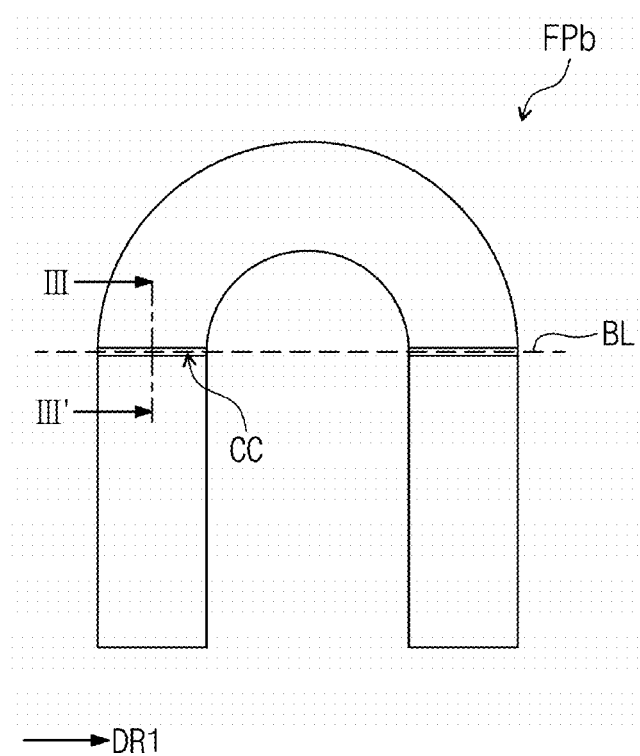
FIG. 5 is a plan view illustrating a coupling film according to another alternative embodiment of the invention.

FIG. 5 is a plan view illustrating a coupling film according to another alternative embodiment of the invention.

Referring to FIG. 5, in an embodiment, a concave groove CC extended and recessed along the bending line BL may be defined in a coupling film FPb. In such an embodiment, where the concave groove CC is defined, the thickness of a bending region may be decreased. Accordingly, a tensile stress or a compressive stress acting on wiring in the coupling film FPb may be decreased.

Figure 6A:
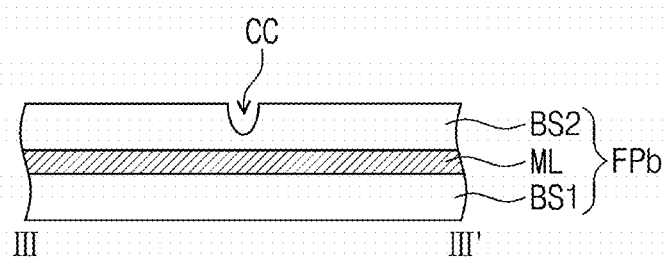
FIG. 6A is a cross-sectional view taken along line of FIG. 5.
Figure 6B:
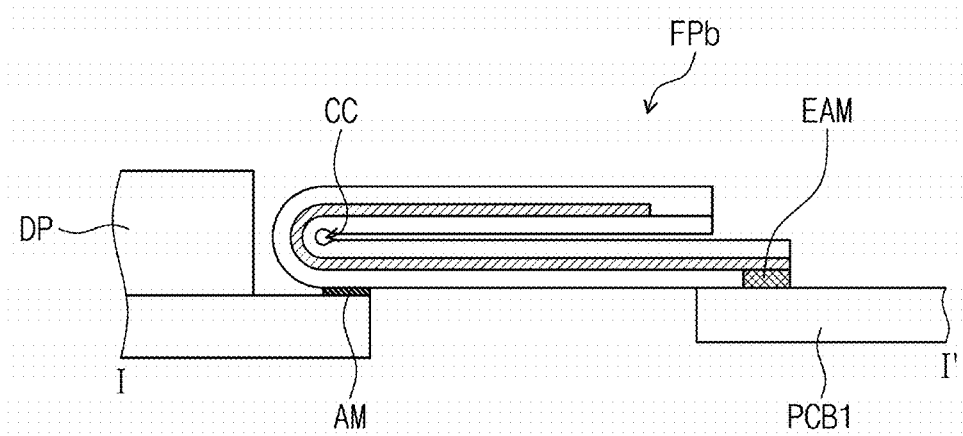
FIG. 6B is a cross-sectional view illustrating a display device including the coupling film of FIG. 6A.

FIG. 6A is a cross-sectional view taken along line of FIG. 5, and FIG. 6B is a cross-sectional view illustrating a display device including the coupling film of FIG. 6A is applied.

For ease of description, a region corresponding to the line I-I' of FIG. 3B is illustrated in FIG. 6B. In FIGS. 6A and 6B, the same or like components as those previously described have been labeled with the same reference characters, and any repetitive detailed description thereof will hereinafter be omitted or simplified.

Referring to FIGS. 6A and 6B, in an embodiment, the coupling film FPb may include a first base layer BS1, a wiring layer ML, and a second base layer BS2. The wiring layer ML may be disposed between the first base layer BS1 and the second base layer BS2.

The first base layer BS1 and the second base layer BS2 may be a layer having flexibility or elasticity to be effectively bent. Each of the first base layer BS1 and the second base layer BS2 may be a plastic film. In one embodiment, for example, each of the first base layer BS1 and the second base layer BS2 may include at least one of acrylic resin, methacrylic resin, polyisoprene, polyvinyl resin, epoxy resin, urethane resin, cellulose resin, siloxane resin, polyimide resin, polyamide resin, and perylene resin. However, the material of each of the first base layer BS1 and the second base layer BS2 is not limited thereto.

The wiring layer ML may include a metal layer of, for example, molybdenum, silver, titanium, copper, aluminum, or alloy thereof. The wiring layer ML may have a single layer structure, or a multilayer structure. The control unit CU of the first circuit board PCB1 (see FIG. 2) and the second circuit board PCB2 may be electrically coupled to each other via the wiring layer ML.

The concave groove CC may be defined or formed in the second base layer BS2. However, the position of the concave groove CC is not limited thereto, but may also be defined in the first base layer BS1. In FIGS. 6A and 6B, the concave groove CC has a semicircular shape when viewed in a cross section, but the shape of the concave groove CC is not limited thereto. In an alternative embodiment, the concave groove CC may have various shapes such as polygonal shapes, when viewed in a cross section, for example, an inverted triangular shape, a quadrangular shape, a pentagonal shape, and the like.

According to an embodiment of the invention, the thickness of a portion of the coupling film FPb may be decreased by the concave groove CC defined in the bending region. In such an embodiment, repulsive force by which the coupling film FPb tends to return to an original flat state thereof may be reduced. Accordingly, stress acting on the wiring layer ML by the repulsive force may be alleviated. In such an embodiment, the coupling film FPb may be bent with a smaller radius of curvature by the concave groove CC.

Figure 7A:
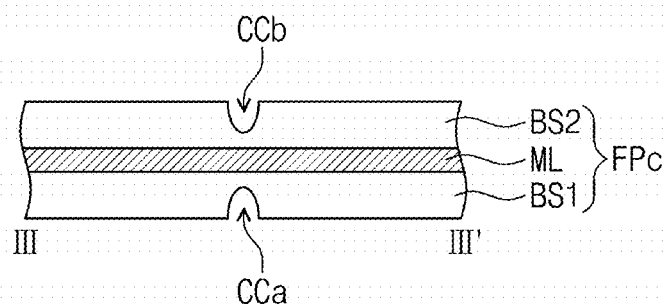
FIG. 7A is a cross-sectional view taken along line of FIG. 5.
Figure 7B:
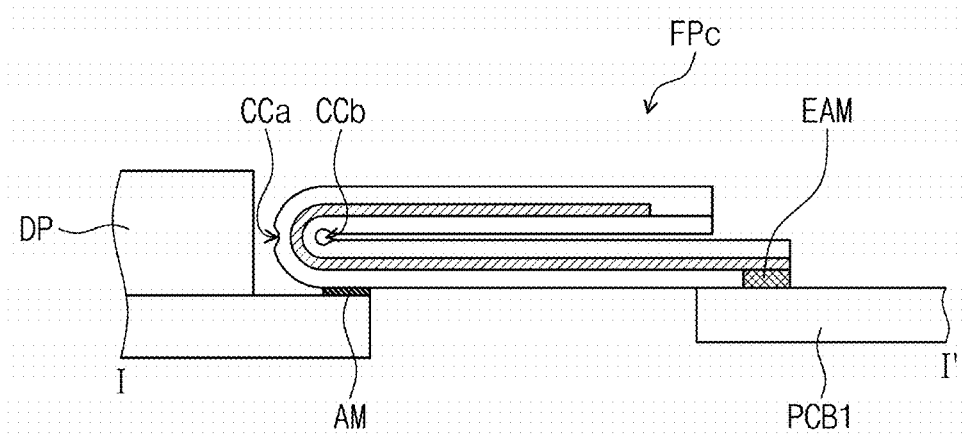
FIG. 7B is a cross-sectional view illustrating a display device including the coupling film of FIG. 7A.

FIG. 7A is a cross-sectional view taken along line of FIG. 5, and FIG. 7B is a cross-sectional view illustrating a display device including the coupling film of FIG. 7A.

For ease of description, a region corresponding to the line I-I' of FIG. 3B is illustrated in FIG. 7B. In FIGS. 7A and 7B, the same or like components as those previously described have been labeled with the same reference characters, and any repetitive detailed description thereof will hereinafter be omitted or simplified.

Referring to FIGS. 7A and 7B, in an embodiment, a coupling film FPc may include a first base layer BS1, the wiring layer ML and a second base layer BS2.

A first concave groove CCa may be defined in the first base layer BS1, and a second concave groove CCb may be defined in the second base layer BS2. Each of the first concave groove CCa and the second concave groove CCb may be defined or formed along the bending line BL extending in the first direction DR1 of FIG. 5.

According to an embodiment of the invention, repulsive force by which the coupling film FPc tends to return to an original flat state thereof may be reduced, and stress acting on the wiring layer ML by the repulsive force may be alleviated, by providing the first concave groove CCa and the second concave groove CCb on both of opposing surfaces of a bending region.

Figure 8:
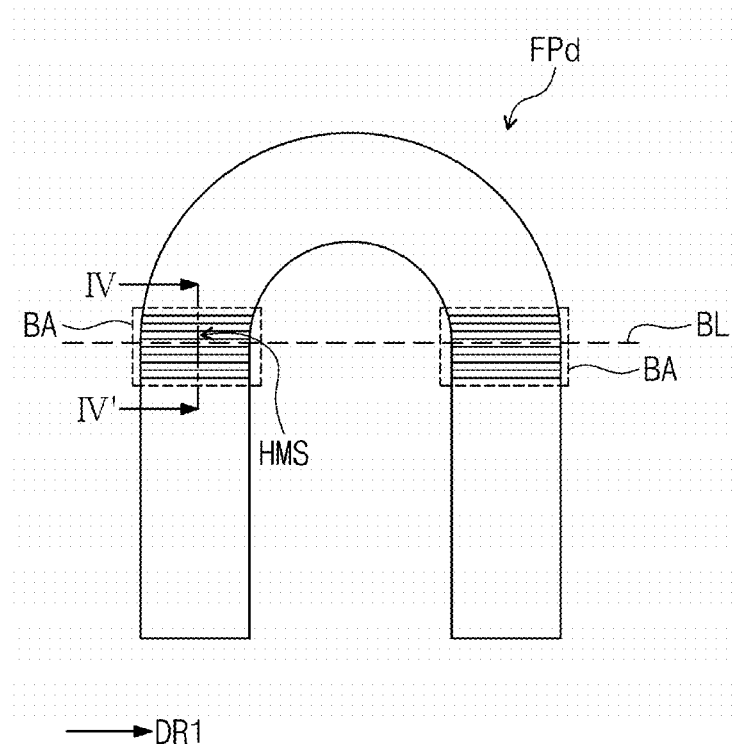
FIG. 8 is a plan view illustrating a coupling film according to another alternative embodiment of the invention.

FIG. 8 is a plan view illustrating a coupling film according to another alternative embodiment of the invention.

Referring to FIG. 8, in an embodiment, a plurality of concave grooves HMS recessed along the bending line BL may be defined in a bending region BA including the bending line BL of a coupling film FPd. The concave grooves HMS may be formed by pressurizing a second base layer BS2. However, the concave grooves HMS are not limited thereto. In such an embodiment, where the concave grooves HMS are provided in the bending region BA, a tensile stress or a compressive stress acting on wiring in the coupling film FPd may be decreased because the bending region around the bending line BL is tensioned or compressed.

Figure 9:
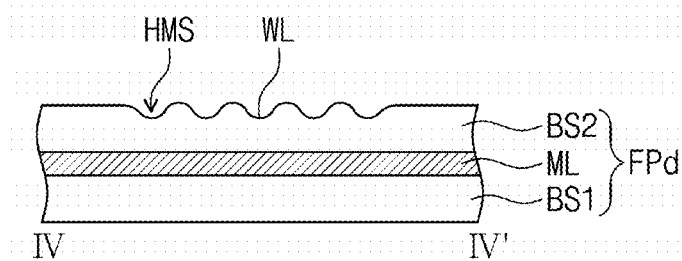
FIG. 9 is a cross-sectional view taken along line IV-IV' of FIG. 8.
Figure 10:
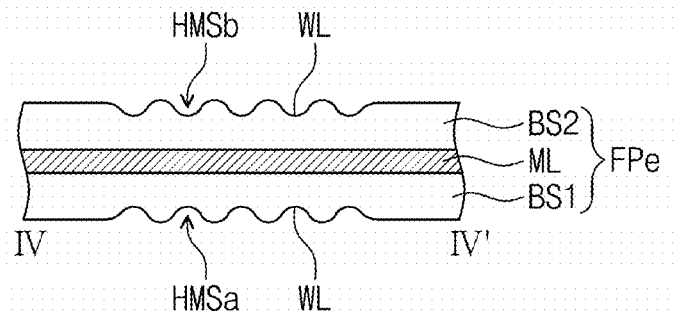
FIG. 10 is a cross-sectional view taken along line IV-IV' of FIG. 8.

FIGS. 9 and 10 are cross-sectional views taken along line IV-IV' of FIG. 8. Referring to FIG. 9, in an embodiment, a cross section taken in a direction perpendicular to the bending line BL may have a corrugated shape WL by the plurality of concave grooves HMS. The plurality of concave grooves HMS may be defined on the second base layer BS2 of the coupling film FPd. However, the corrugated shape WL is not limited thereto, but may also be provided on the first base layer BS1.

Referring to FIG. 10, in an alternative embodiment, a plurality of concave grooves HMSa and HMSb may be respectively defined on a first base layer BS1 and a second base layer BS2 of a coupling film FPe. Accordingly, a cross section taken in the direction perpendicular to the bending line BL of the coupling film FPe may have the corrugated shape WL on both of outer surfaces of the coupling film FPe.

According to an embodiment of the invention, repulsive force by which the coupling films FPd and FPe tend to return to an original flat state thereof may be reduced, and thus stress acting on the wiring layer ML may be decreased, by providing the corrugated shape WL in a bending region.

Figure 11:
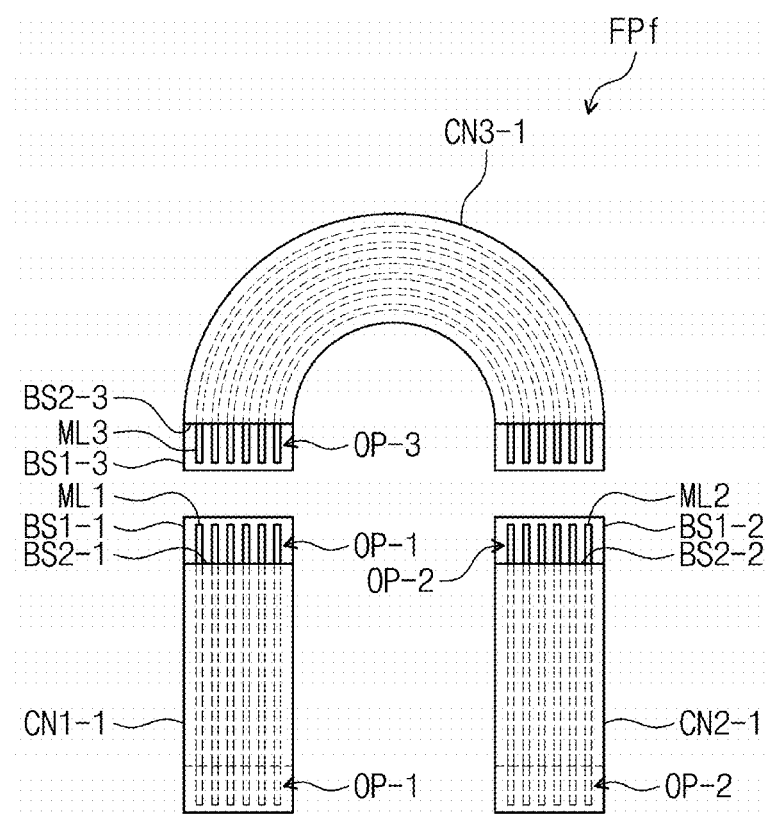
FIG. 11 is a plan view illustrating a coupling film according to another alternative embodiment of the invention.

FIG. 11 is a plan view illustrating a coupling film according to another alternative embodiment of the invention.

Referring to FIG. 11, in an embodiment, a coupling film FPf may include a first coupling part CN1-1, a second coupling part CN2-1, and a third coupling part CN3-1. The first coupling part CN1-1, the second coupling part CN2-1, and the third coupling part CN3-1 may be members separately defined from each other.

In such an embodiment, as shown in FIG. 11, the first coupling part CN1-1 may include a first base layer BS1-1, a second base layer BS2-1, and a wiring layer ML1 disposed between the first base layer BS1-1 and the second base layer BS2-1. The second coupling part CN2-1 may include a first base layer BS1-2, a second base layer BS2-2, and a wiring layer ML2 disposed between the first base layer BS1-2 and the second base layer BS2-2. The third coupling part CN3-1 may include a first base layer BS1-3, a second base layer BS2-3, and a wiring layer ML3 disposed between the first base layer BS1-3 and the second base layer BS2-3.

An opening region OP-1 for exposing the wiring layer ML1 may be defined in the first base layer BS1-1 or the second base layer BS2-1 of the first coupling part CN1-1. In one embodiment, for example, two opening regions OP-1 may be defined in the first coupling part CN1-1. One of the two opening regions OP-1 of the first coupling part CN1-1 may be electrically coupled to the first circuit board PCB1 (see FIG. 2.), and the other of the two opening region sOP-1 of the first coupling part CN1-1 may be electrically coupled to the third coupling part CN3-1.

An opening region OP-2 for exposing the wiring layer ML2 may be defined in the first base layer BS1-2 or the second base layer BS2-2 of the second coupling part CN2-1. In one embodiment, for example, two opening regions OP-2 may be defined in the second coupling part CN2-1. One of the two opening regions OP-2 of the second coupling part CN2-1 may be electrically coupled to the second circuit board PCB2 (see FIG. 2.), and the other of the two opening regions OP-2 of the second coupling part CN2-1 may be electrically coupled to the third coupling part CN3-1.

An opening region OP-3 for exposing the wiring layer ML3 may be defined in the first base layer BS1-3 or the second base layer BS2-3 of the third coupling part CN3-1. In one embodiment, for example, two opening regions OP-3 may be defined in the third coupling part CN3-1. One of the two opening regions OP-3 of the third coupling part CN3-1 may be electrically coupled to the first coupling part CN1-1, and the other of the two opening regions OP-3 of the third coupling part CN3-1 may be electrically coupled to the second coupling part CN2-1.

Figure 12A:
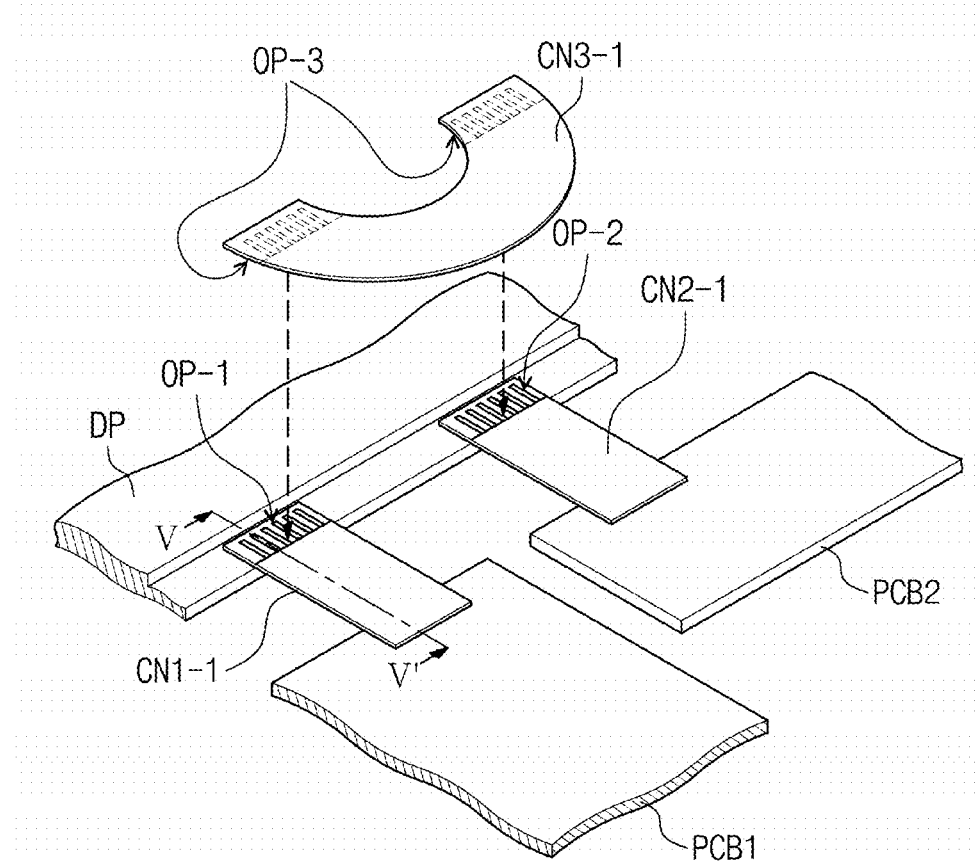
FIG. 12A is an enlarged exploded perspective view illustrating a part of a display device including the coupling film of FIG. 11.
Figure 12B:
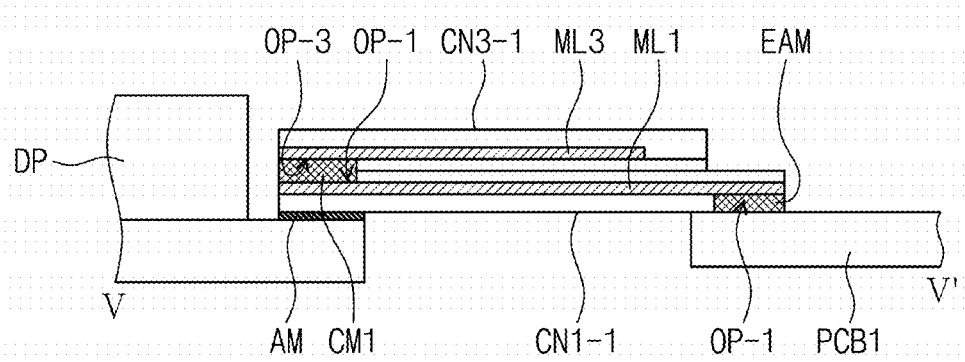
FIG. 12B is a cross-sectional view taken along line V-V' of FIG. 12A.

FIG. 12A is an enlarged exploded perspective view illustrating a part of a display device including the coupling film of FIG. 11, and FIG. 12B is a cross-sectional view taken along line V-V' of FIG. 12A.

FIG. 12B may be a cross-sectional view taken in a state that the third coupling part CN3-1 is attached to the first coupling part CN1-1 and the second coupling part CN2-1 of FIG. 12A. In FIGS. 12A and 12B, the same or like components as those previously described have been labeled with the same reference characters, and any repetitive detailed description thereof will hereinafter be omitted or simplified.

Referring to FIGS. 12A and 12B, in an embodiment, the first coupling part CN1-1 is attached to the display panel DP and the first circuit board PCB1. The one of the two opening regions OP-1 of the first coupling part CN1-1 may be attached to the first circuit board PCB1 by the conductive adhesive member EAM. Accordingly, the wiring layer ML1 may be electrically coupled to the first circuit board PCB1.

The second coupling part CN2-1 is attached to the display panel DP, and the second circuit board PCB2. Although not illustrated, the one of the two opening regions OP-2 (see FIG. 11.) of the second coupling part CN2-1 may be attached to the second circuit board PCB2 by the conductive adhesive member EAM.

The third coupling part CN3-1 may be attached to the display panel DP to which the first coupling part CN1-1 and the second coupling part CN2-1 are attached. In such an embodiment the first coupling part CN1-1 and the second coupling part CN2-1 may be disposed between the display panel DP and the third coupling part CN3-1.

A first coupling member CM1 may be disposed between the first coupling part CN1-1 and the third coupling part CN3-1, and the first coupling member CM1 may couple the first coupling part CN1-1 and the third coupling part CN3-1 to each other. The first coupling member CM1 may be a conductive adhesive member. In one embodiment, for example, the first coupling member CM1 may be an ACF.

The first coupling member CM1 may be disposed between the opening region OP-1 of the first coupling part CN1-1, and the opening region OP-3 of the third coupling part CN3-1. Accordingly, the exposed portion of the wiring layer ML1 of the first coupling part CN1-1, and the exposed portion of the wiring layer ML3 of the third coupling part CN3-1 may be electrically coupled to each other.

A second coupling member (not illustrated) may be disposed between the second coupling part CN2-1 and the third coupling part CN3-1, and a configuration thereof may be similar to the cross section illustrated in FIG. 12B. Accordingly, description thereof will be omitted for convenience of description.

Figure 13:
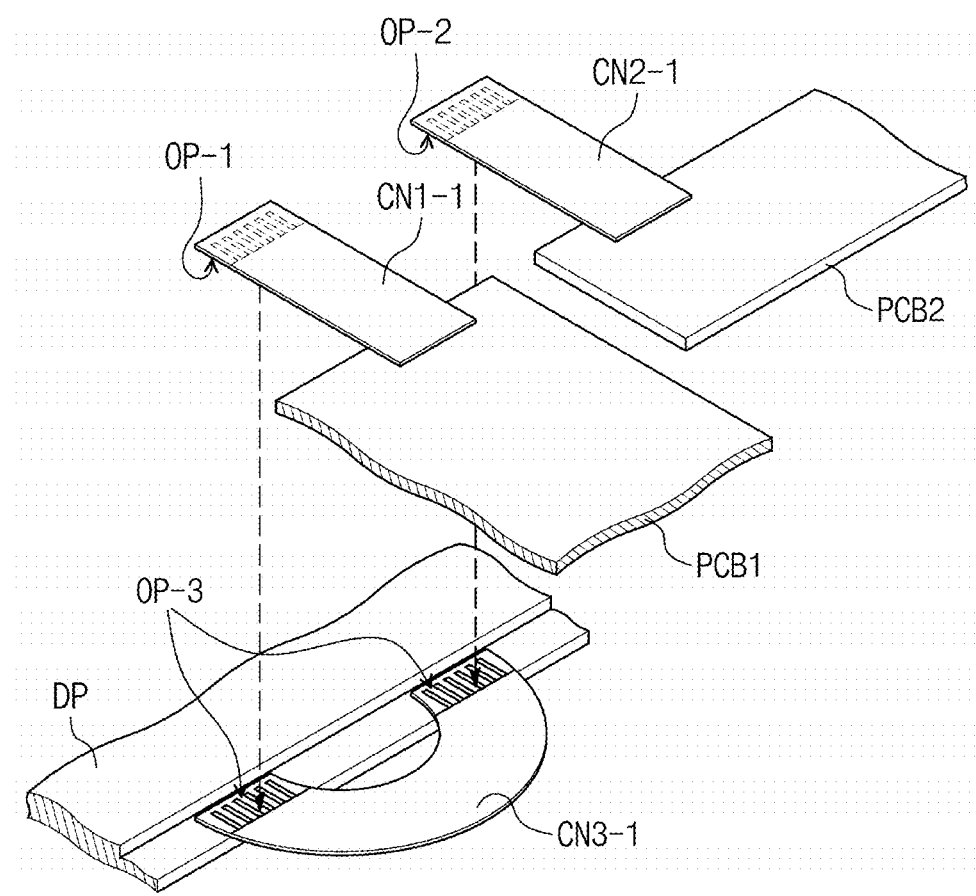
FIG. 13 is an enlarged exploded perspective view illustrating a part of a display device according to another alternative embodiment of the invention.

FIG. 13 is an enlarged exploded perspective view illustrating a part of a display device according to another alternative embodiment of the invention. In FIG. 13, the same or like components as those previously described have been labeled with the same reference characters, and any repetitive detailed description thereof will hereinafter be omitted or simplified.

A position of the third coupling part CN3-1 in the display device illustrated in FIG. 13 is different from that of the third coupling part CN3-1 in FIG. 12B. Referring to FIG. 13, the third coupling part CN3-1 may be disposed on the display panel DP, and the first coupling part CN1-1 and the second coupling part CN2-1 may be disposed on the third coupling part CN3-1.

The third coupling part CN3-1 may be coupled to the display panel DP after the third coupling part CN3-1 has been coupled to the first coupling part CN1-1 and the second coupling part CN2-1, or the first and the second coupling parts CN1-1 and CN2-1 may be attached to the third coupling part CN3-1 after the third coupling part CN3-1 has been coupled first to the display panel DP.

The wiring layers ML1 and ML3 (see FIG. 11.) exposed to face each other may be electrically coupled to each other via the opening region OP-1 of the first coupling part CN1-1 and the opening region OP-3 of the third coupling part CN3-1. In such an embodiment, the wiring layers ML2 and ML3 (see FIG. 11.) exposed to face each other may be electrically coupled to each other via the opening region OP-2 of the second coupling part CN2-1 and the opening region OP-3 of the third coupling part CN3-1.

Figure 14:
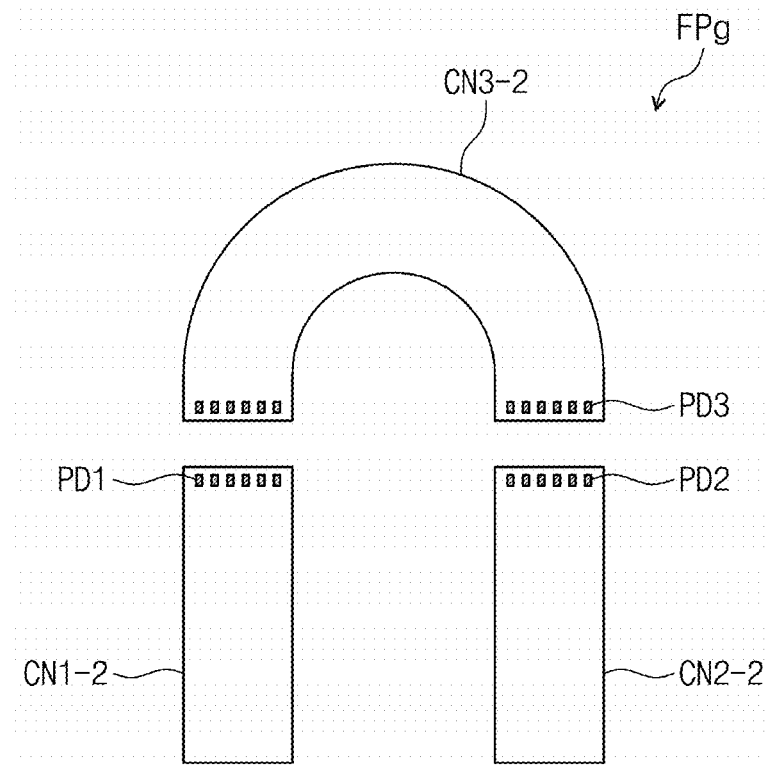
FIG. 14 is a plan view illustrating a coupling film according to another alternative embodiment of the invention.
Figure 15A:
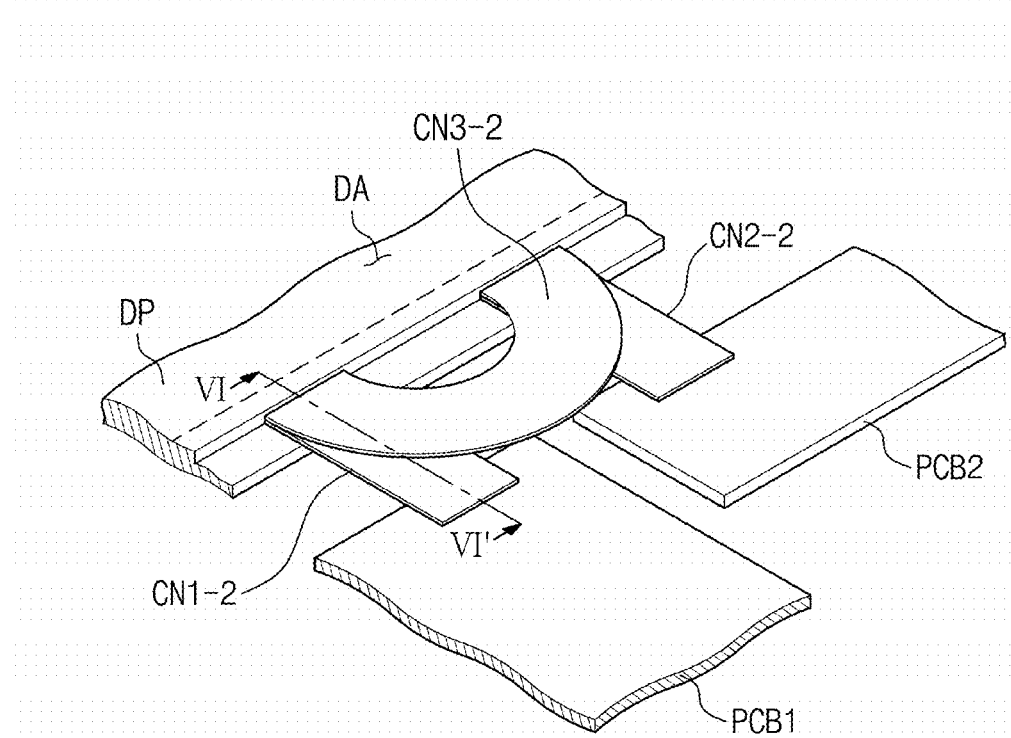
FIG. 15A is an enlarged perspective view illustrating a part of a display device including the coupling film of FIG. 14.
Figure 15B:
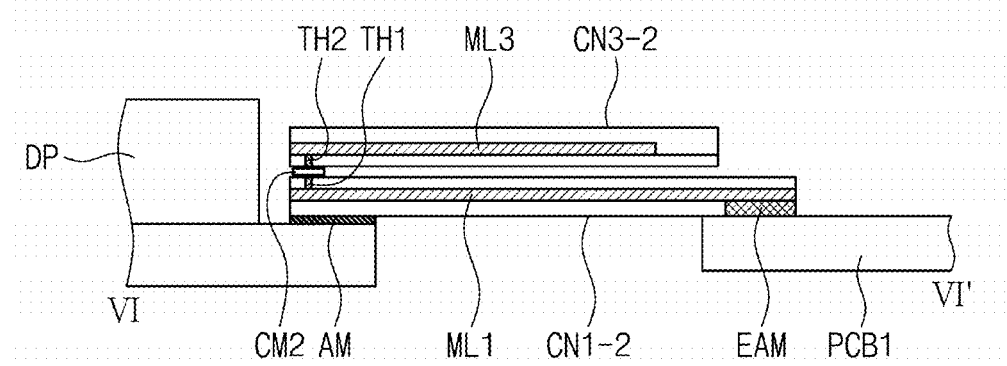
FIG. 15B is a cross-sectional view taken along line VI-VI' of FIG. 15A.

FIG. 14 is a plan view illustrating a coupling film according to another alternative embodiment of the invention, FIG. 15A is an enlarged perspective view illustrating a part of a display device including the coupling film of FIG. 14, and FIG. 15B is a cross-sectional view taken along line VI-VI' of FIG. 15A.

Referring to FIGS. 14, 15A and 15B, in an embodiment, a coupling film FPg may include a first coupling part CN1-2, a second coupling part CN2-2, and a third coupling part CN3-2. The first coupling part CN1-2, the second coupling part CN2-2, and the third coupling part CN3-2 may be members separately defined from each other.

The first coupling part CN1-2 may include a pad part PD1 electrically coupled to the wiring layer ML1 of the first coupling part CN1-2 via a through-hole TH1. The second coupling part CN2-2 may include a pad part PD2 electrically coupled to a wiring layer of the second coupling part CN2-2 via a through-hole. The third coupling part CN3-2 may include a pad part PD3 electrically coupled to the wiring layer ML3 of the third coupling part CN3-2 via a through-hole TH2.

A first coupling member CM2 may be disposed between the pad part PD1 of the first coupling part CN1-2, and the pad part PD3 of the third coupling part CN3-2. A second coupling member (not illustrated) may be disposed also between the pad part PD2 of the second coupling part CN2-2, and the pad part PD3 of the third coupling part CN3-2. The first coupling member CM2 and the second coupling member may be a conductive adhesive member, for example, an ACF.

Although some exemplary embodiments of the invention have been described herein, it is understood that various changes and modifications can be made by those skilled in the art within the spirit and scope of the invention defined by the following claims or their equivalents. Therefore, the scope of the invention is defined by the following claims or the equivalents other than the foregoing detailed description.

What is claimed is:

1. A display device comprising:
a display panel;
a first circuit board electrically coupled to the display panel;
a second circuit board electrically coupled to the display panel; and
a coupling film which electrically couples the first circuit board, the second circuit board, and the display panel, wherein the coupling film comprises:
a first coupling part disposed between the display panel and the first circuit board and including a first region disposed on the first circuit board, and a second region disposed on the display panel in a top plane view;
a second coupling part disposed between the display panel and the second circuit board and including a third region disposed on the second circuit board, and a fourth region disposed on the display panel in the top plane view; and
a third coupling part overlapping the second region and the fourth region, and electrically coupled to each of the second region and the fourth region.

2. The display device of claim 1, further comprising a control unit disposed on one of the first circuit board and the second circuit board.

3. The display device of claim 1, further comprising a plurality of flexible circuit boards,
wherein the flexible circuit boards comprises:
a first flexible circuit board disposed between the display panel and the first circuit board to electrically couple the display panel and the first circuit board to each other; and
a second flexible circuit board disposed between the display panel and the second circuit board to electrically couple the display panel and the second circuit board to each other.

4. The display device of claim 3, wherein the coupling film is disposed between the first flexible circuit board and the second flexible circuit board.

5. The display device of claim 1, wherein the third coupling part extends from the first coupling part toward the second coupling part, and
the first coupling part, the second coupling part and the third coupling part collectively define a single unitary body.

6. The display device of claim 1, wherein
the first circuit board and the second circuit board are spaced apart in a first direction,
the coupling film has a shape bent along a bending line extending in the first direction, and
the third coupling part overlaps each of the first coupling part and the second coupling part in the top plane view.

7. The display device of claim 1, wherein the third coupling part is disposed on the second region of the first coupling part, and the fourth region of the second coupling part.

8. The display device of claim 1, wherein the coupling film further comprises:
a first coupling member disposed between the first coupling part and the third coupling part to couple the first coupling part and the third coupling part to each other; and
a second coupling member disposed between the second coupling part and the third coupling part to couple the second coupling part and the third coupling part to each other.

9. A display device comprising:
a display panel;
a plurality of flexible circuit boards attached to a side of the display panel;
a first circuit board electrically coupled to the display panel;
a second circuit board electrically coupled to the display panel;
a first flexible circuit boards disposed between the display panel and the first circuit board to electrically couple the display panel and the first circuit board to each other; and
a second flexible circuit board disposed between the display panel and the second circuit board to electrically couple the display panel and the second circuit board to each other;
a coupling film disposed between the first flexible circuit board and the second flexible circuit board and electrically coupled to the first circuit board, the second circuit board and the display panel,
wherein
the coupling film includes a bending region bent along a bending line extending in a direction parallel to a side of the display panel, and
the bending region overlaps the display panel.

10. The display device of claim 1, wherein the bending region is disposed on the display panel and overlaps a major surface plane defining the display panel in a top plane view.

11. The display device of claim 1, wherein the first circuit board and the second circuit board are spaced apart in a first direction,
wherein the coupling film comprising a first region connected to the display panel, a second region connected to the first circuit board, and a third region connected to the second first circuit board.

* * * * *